United States Patent
Tsukada et al.

(10) Patent No.: US 11,849,545 B2
(45) Date of Patent: Dec. 19, 2023

(54) CIRCUIT FORMATION METHOD

(71) Applicant: FUJI CORPORATION, Chiryu (JP)

(72) Inventors: Kenji Tsukada, Toyota (JP); Ryojiro Tominaga, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 212 days.

(21) Appl. No.: 17/274,984

(22) PCT Filed: Oct. 16, 2018

(86) PCT No.: PCT/JP2018/038426
§ 371 (c)(1),
(2) Date: Mar. 10, 2021

(87) PCT Pub. No.: WO2020/079744
PCT Pub. Date: Apr. 23, 2020

(65) Prior Publication Data
US 2022/0039263 A1 Feb. 3, 2022

(51) Int. Cl.
*H05K 3/12* (2006.01)
*H05K 3/18* (2006.01)
(Continued)

(52) U.S. Cl.
CPC ............ *H05K 3/1241* (2013.01); *H05K 3/18* (2013.01); *H05K 3/28* (2013.01); *H05K 3/321* (2013.01);
(Continued)

(58) Field of Classification Search
CPC ...... H05K 3/321; H05K 3/305; H05K 3/4007; H05K 2203/1461; H05K 3/1241;
(Continued)

(56) References Cited

U.S. PATENT DOCUMENTS

2004/0108133 A1* 6/2004 Sano .................... H05K 3/4007
 257/737
2005/0218195 A1* 10/2005 Wilson .................. H05K 3/305
 257/E23.021
(Continued)

FOREIGN PATENT DOCUMENTS

JP 11-16950 A 1/1999
JP 2000-11760 A 1/2000
(Continued)

OTHER PUBLICATIONS

Hirai et a, "Development of flip chip attach technology using Ag paste bump which formed on printed wiring board electrodes," International Symposium on Electronic Materials and Packaging (EMAP2000) (Cat. No. 00EX458), 2000, pp. 1-6. (Year: 2000).*
International Search Report dated Dec. 18, 2018 in PCT/JP2018/038426 filed on Oct. 16, 2018, citing references AA and AO-AS therein, 2 pages.

*Primary Examiner* — A. Dexter Tugbang
(74) *Attorney, Agent, or Firm* — Oblon, McClelland, Maier & Neustadt, L.L.P.

(57) ABSTRACT

A circuit formation method includes: a protruding portion formation step of forming a protruding portion by applying a curable viscous fluid onto a base and curing the curable viscous fluid; a wiring formation step of forming a wiring extending toward the protruding portion by applying a metal-containing liquid containing nanometer-sized metal fine particles onto a base and making the metal-containing liquid conductive; a paste application step of applying a resin paste containing micrometer-sized metal particles different from the metal-containing liquid on the protruding portion and the wiring, such that the protruding portion and the wiring are connected to each other; and a component placement step of placing a component having an electrode on the base, such that the electrode is in contact with the resin paste applied on the protruding portion.

9 Claims, 7 Drawing Sheets

(51) Int. Cl.
*H05K 3/28* (2006.01)
*H05K 3/32* (2006.01)
*H05K 3/40* (2006.01)
*H05K 1/09* (2006.01)
*H05K 3/30* (2006.01)

(52) U.S. Cl.
CPC ........... *H05K 3/4007* (2013.01); *H05K 1/095* (2013.01); *H05K 3/1283* (2013.01); *H05K 3/305* (2013.01); *H05K 3/323* (2013.01); *H05K 2203/1461* (2013.01)

(58) Field of Classification Search
CPC ........ H05K 3/18; H05K 3/1283; H05K 3/323; H05K 3/28; H05K 1/095
See application file for complete search history.

(56) References Cited

U.S. PATENT DOCUMENTS

2006/0250452 A1    11/2006  Sano et al.
2009/0229123 A1*   9/2009   Sakai .................... H05K 3/323
                                                       29/854

FOREIGN PATENT DOCUMENTS

| JP | 2003-347715 A | 12/2003 |
| JP | 2005-123380 A | 5/2005 |
| JP | 2006-332592 A | 12/2006 |
| JP | 2014229784 A * | 12/2014 |
| JP | WO2016/189577 A1 | 12/2016 |

* cited by examiner

CIRCUIT FORMATION METHOD

TECHNICAL FIELD

The present application relates to a circuit formation method for a circuit including a wiring formed by discharging a metal-containing liquid and a component placed, such that an electrode is in contact with the wiring via a resin paste applied on the wiring.

BACKGROUND ART

In recent years, a technique for forming a circuit as described in the following Patent Literature on-demand by discharging a metal-containing liquid onto a base has been developed.

PATENT LITERATURE

Patent Literature 1: JP-A-2003-347715

BRIEF SUMMARY

Technical Problem

In a circuit formed by discharging a metal-containing liquid onto a base, wiring is formed by firing the metal-containing liquid, and a resin paste containing metal particles is applied, such that metal particles are in contact with the wiring. A circuit is formed by placing the component having the electrode, such that the resin paste and the electrode are in contact with each other. There is an object of the present disclosure to suitably form a circuit by such a method.

Solution to Problem

In order to solve the above problem, the present specification discloses a circuit formation method includes a protruding portion formation step of forming a protruding portion by applying a curable viscous fluid onto a base and curing the curable viscous fluid, a wiring formation step of forming a wiring extending toward the protruding portion by applying a metal-containing liquid containing metal particles onto the base so that the metal-containing liquid becomes conductive, a paste application step of applying a resin paste, containing metal particles different from the metal-containing liquid, on the protruding portion and the wiring, such that the protruding portion and the wiring are connected to each other, and a component placement step of placing a component having an electrode onto the base, such that the electrode is in contact with the resin paste applied on the protruding portion.

Advantageous Effects

With the present disclosure, a protruding portion is formed by applying a curable viscous fluid is applied onto a base and curing the curable viscous fluid, and a wiring extending toward the protruding portion is formed by application of a metal-containing liquid and conductivity. After the resin paste containing the metal particles is applied on the protruding portion and the wiring, such that the protruding portion and the wiring are connected to each other, and the component having the electrode is placed, such that the resin paste and the electrode are in contact with each other. As a result, when the component is placed, the connection between the electrode and the wiring is ensured by entering the resin paste between the electrode and the protruding portion, and it is possible to form the circuit suitably.

DESCRIPTION OF EMBODIMENTS

Figure 1:
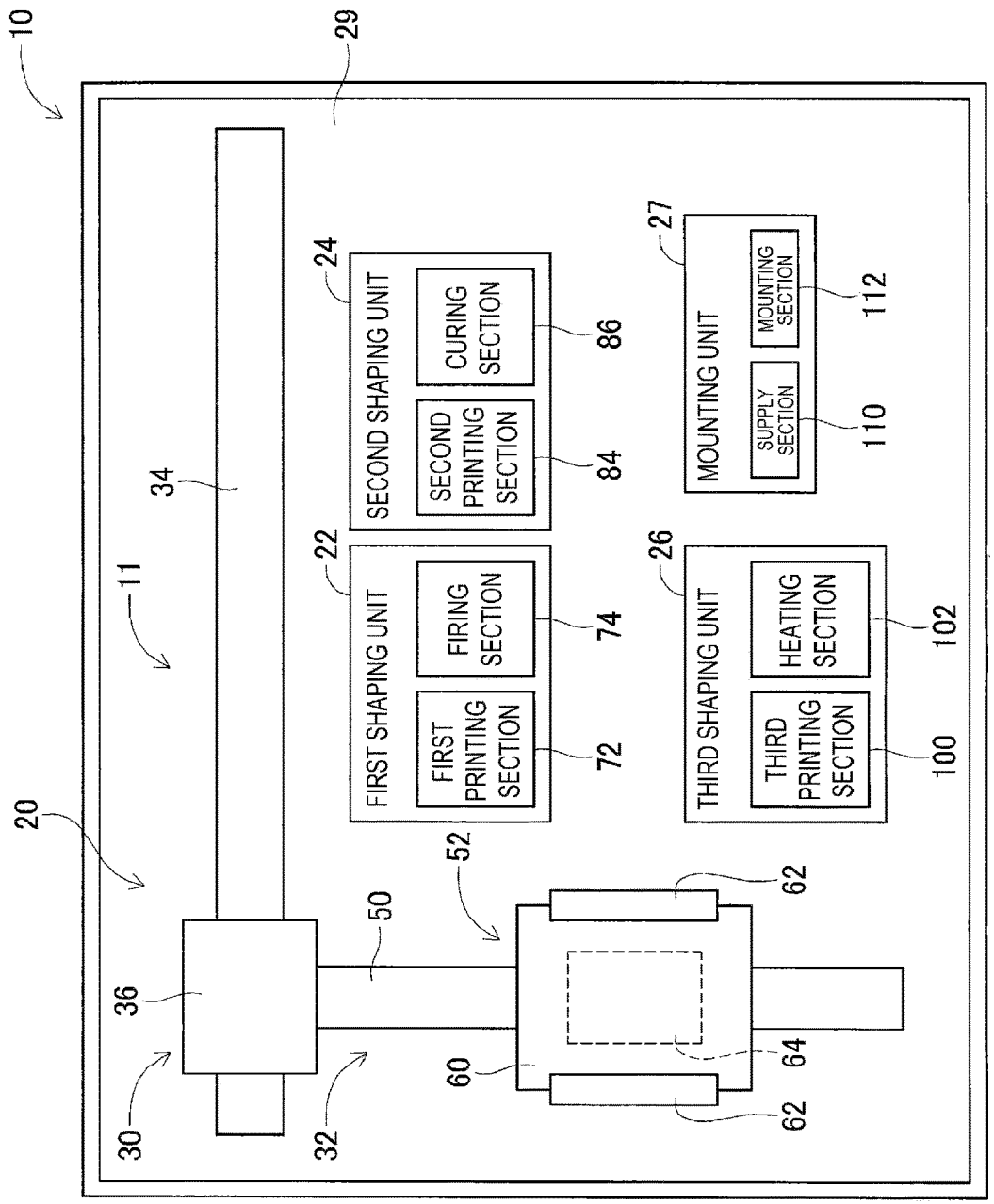
FIG. 1 is a diagram showing a circuit formation device.

FIG. 1 shows circuit formation device 10. Circuit formation device 10 includes conveyance device 20, first shaping unit 22, second shaping unit 24, third shaping unit 26, mounting unit 27, and control device (see FIG. 2) 28. Conveyance device 20, first shaping unit 22, second shaping unit 24, third shaping unit 26, and mounting unit 27 are disposed on base 29 of circuit formation device 10. Base 29 has a generally rectangular shape, and in the following description, a longitudinal direction of base 29 is referred to as an X-axis direction, a short direction of base 29 is referred to as a Y-axis direction, and a direction orthogonal to both the X-axis direction and the Y-axis direction is referred to as a Z-axis direction.

Conveyance device 20 includes X-axis slide mechanism 30 and Y-axis slide mechanism 32. X-axis slide mechanism 30 has X-axis slide rail 34 and X-axis slider 36. X-axis slide rail 34 is disposed on base 29 to extend in the X-axis direction. X-axis slider 36 is held by X-axis slide rail 34 to be slidable in the X-axis direction. Further, X-axis slide mechanism 30 has electromagnetic motor (see FIG. 2) 38, and moves X-axis slider 36 to any position in the X-axis direction by driving electromagnetic motor 38. Furthermore, Y-axis slide mechanism 32 has Y-axis slide rail 50 and stage 52. Y-axis slide rail 50 is disposed on base 29 to extend in the Y-axis direction and is movable in the X-axis direction.

A first end portion of Y-axis slide rail 50 is connected to X-axis slider 36. Stage 52 is held on Y-axis slide rail 50 to be slidable in the Y-axis direction. Further, Y-axis slide mechanism 32 has electromagnetic motor (see FIG. 2) 56, and moves stage 52 to any position in the Y-axis direction by driving electromagnetic motor 56. In this manner, stage 52 is moved to any position on base 29 with driving of X-axis slide mechanism 30 and Y-axis slide mechanism 32.

Stage 52 has base plate 60, holding devices 62, and lifting and lowering device 64. Base plate 60 is formed in a flat plate shape, and a board is placed on an upper surface of base plate 60. Holding devices 62 are provided on both sides of base plate 60 in the X-axis direction. The board placed on base plate 60 is fixedly held by sandwiching both edge portions of the board in the X-axis direction with holding devices 62. In addition, lifting and lowering device 64 is disposed under base plate 60, and lifts and lowers base plate 60.

First shaping unit 22 is a unit that shapes a wiring on the board placed on base plate 60 of stage 52, and has first printing section 72 and firing section 74. First printing section 72 has inkjet head (see FIG. 2) 76, and inkjet head 76 linearly discharges metal ink. The metal ink is ink obtained by dispersing nanometer-sized metal fine particles in a solvent. A surface of the metal fine particle is coated with a dispersant and aggregation in the solvent is prevented. Further, inkjet head 76 discharges the metal ink from multiple nozzles by, for example, a piezo method using a piezoelectric element.

Firing section 74 has laser irradiation device (see FIG. 2) 78. Laser irradiation device 78 is a device that irradiates the discharged metal ink with laser, and the metal ink irradiated with the laser is fired to form the wiring. Firing of the metal ink is a phenomenon in which energy is applied so as to vaporize the solvent and decompose a protective film of the metal fine particle, that is, the dispersant, and the metal fine particles are contacted or fused with each other, and thus conductivity is increased. Then, the metal ink is fired to form a metal wiring.

Further, second shaping unit 24 is a unit that shapes a resin layer on the board placed on base plate 60 of stage 52, and has second printing section 84 and curing section 86. Second printing section 84 has inkjet head (see FIG. 2) 88, and inkjet head 88 discharges an ultraviolet curable resin. The ultraviolet curable resin is a resin that is cured by irradiation with ultraviolet rays. Inkjet head 88 may be, for example, a piezo type inkjet head using a piezoelectric element, or may be a thermal type inkjet head in which a resin is heated to generate air bubbles, which are discharged from multiple nozzles.

Curing section 86 has flattening device (see FIG. 2) 90 and irradiation device (see FIG. 2) 92. Flattening device 90 flattens an upper surface of the ultraviolet curable resin discharged by inkjet head 88, and for example, scrapes up excess resin by a roller or a blade while smoothening the surface of the ultraviolet curable resin, to make the thickness of the ultraviolet curable resin uniform. Further, irradiation device 92 includes a mercury lamp or an LED as a light source, and irradiates the discharged ultraviolet curable resin with ultraviolet rays. With this, the discharged ultraviolet curable resin is cured to form the resin layer.

Third shaping unit 26 is a unit that shapes a connection part between an electrode of an electronic component and the wiring on the board placed on base plate 60 of stage 52, and has third printing section 100 and heating section 102. Third printing section 100 includes transfer device 106 (see FIG. 2), and transfer device 106 transfers the conductive resin paste. Specifically, transfer device 106 includes a tray (not shown) for storing the conductive resin paste, and a transfer pin (not shown). Then, the tip portion of the transfer pin is immersed in the tray, whereby the conductive resin paste adheres to the tip portion of the transfer pin, and the tip portion of the transfer pin is in contact with an arbitrary position, whereby the conductive resin paste is transferred to the arbitrary position. The conductive resin paste is a paste in which the micrometer-sized metal particles are dispersed in a resin cured by heating.

Incidentally, the metal particles are flake-shaped particles. Since a viscosity of the conductive resin paste is relatively high, it is possible to transfer the conductive resin paste by transfer device 106 suitably. However, the transfer amount tends to be ununiform.

Heating section 102 has heater (see FIG. 2) 108. Heater 108 is a device that heats the discharged conductive resin paste, and a resin is cured in the heated conductive resin paste. At this time, in the conductive resin paste, the cured resin is contracted, and the flake-shaped metal particles dispersed in the resin come into contact with each other. As a result, the conductive resin paste exhibits conductivity.

In addition, mounting unit 27 is a unit that mounts the electronic component on the board placed on base plate 60 of stage 52, and has supply section 110 and mounting section 112. Supply section 110 has multiple tape feeders (see FIG. 2) 114 that feed the taped electronic components one by one, and supplies the electronic component to a supply position. Supply section 110 is not limited to tape feeder 114, and may be a tray-type supply device that supplies the electronic component by picking up the electronic component from a tray. Supply section 110 may be configured to include both the tape-type and the tray-type, or other type of supply device.

Mounting section 112 has mounting head (see FIG. 2) 116 and moving device (see FIG. 2) 118. Mounting head 116 has a suction nozzle (not shown) for picking up and holding the electronic component. The suction nozzle picks up and holds the electronic component by picking up air as a negative pressure is supplied from a positive and negative pressure supply device (not shown). As a slight positive pressure is supplied from the positive and negative pressure supply device, the electronic component is separated. In addition, moving device 118 moves mounting head 116 between the supply position of the electronic component by tape feeder 114 and the board placed on base plate 60. As a result, in mounting section 112, the electronic component supplied from tape feeder 114 is held by the suction nozzle, and the electronic component held by the suction nozzle is mounted on the board.

Figure 2:
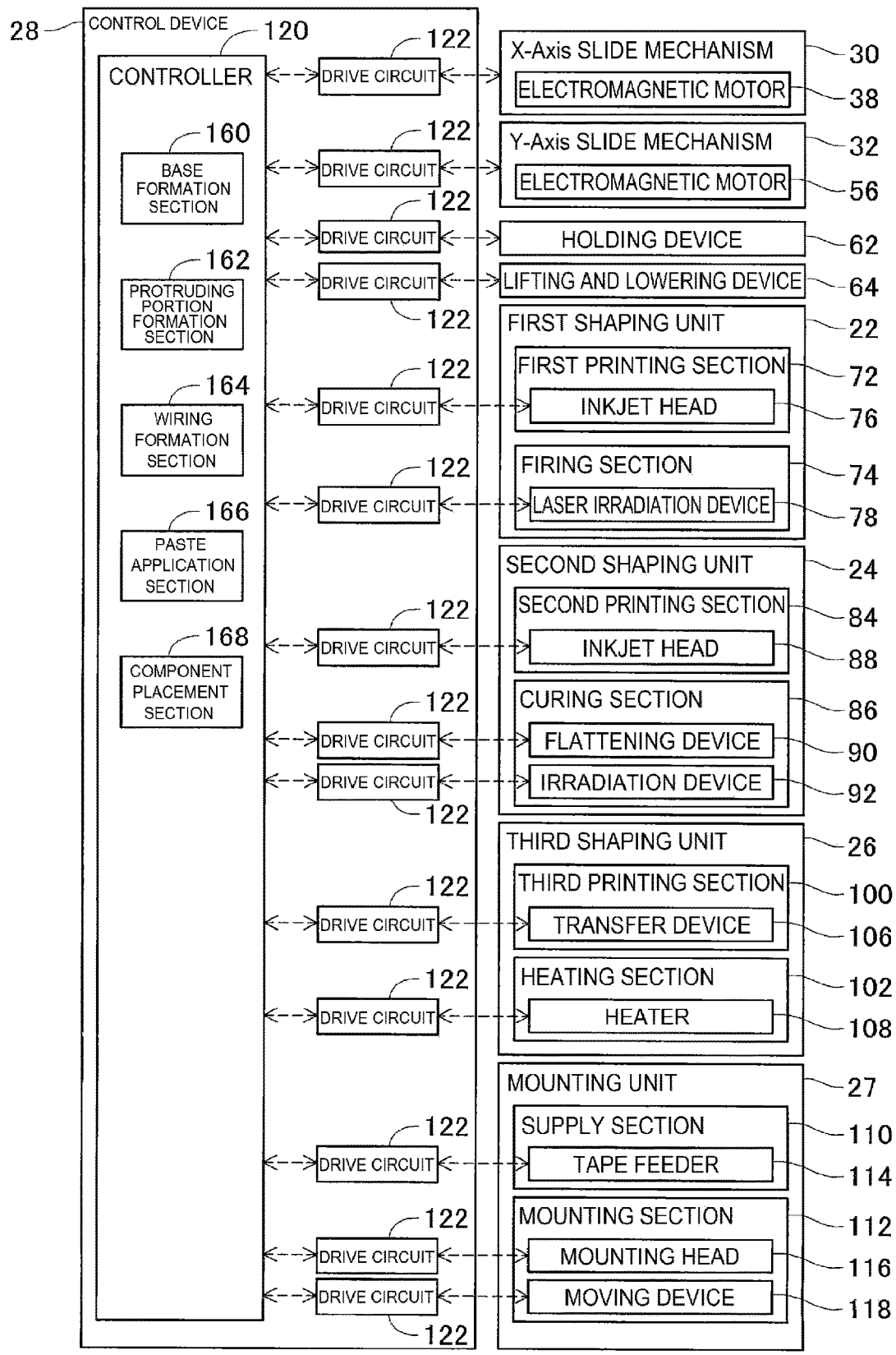
FIG. 2 is a block diagram showing a control device.

Further, as shown in FIG. 2, control device 28 includes controller 120 and multiple drive circuits 122. Multiple drive circuits 122 are connected to electromagnetic motors 38, 56, holding device 62, lifting and lowering device 64, inkjet head 76, laser irradiation device 78, inkjet head 88, flattening device 90, irradiation device 92, transfer device 106, heater 108, tape feeder 114, mounting head 116, and moving device 118. Controller 120 includes CPU, ROM, RAM, or the like, mainly includes a computer, and is connected to multiple drive circuits 122. Accordingly, Controller 120 controls the operations of conveyance device 20, first shaping unit 22, second shaping unit 24, third shaping unit 26, and mounting unit 27.

With the configuration described above, in circuit formation device 10, a resin laminate is formed on board (see FIG. 3) 70, and the wiring is formed on an upper surface of the resin laminate. The electrode of the electronic component is connected to the wiring via the resin paste, and at this time, a short circuit, a connection failure, or the like may occur in accordance with the amount of the resin paste.

Figure 3:
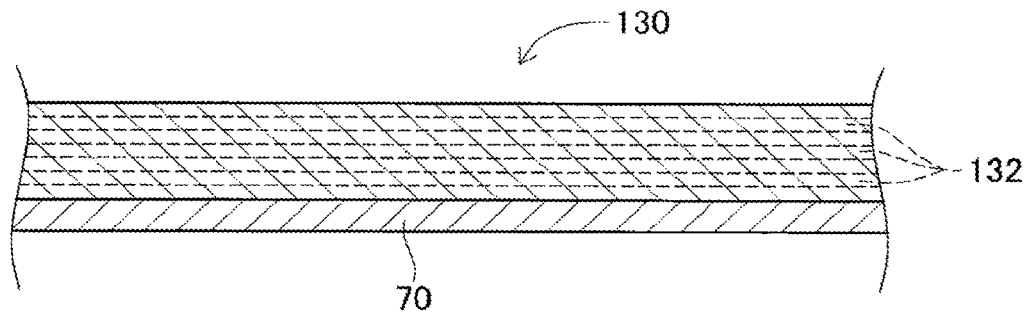
FIG. 3 is a cross-sectional view showing a circuit in a state where a resin laminate is formed.

Specifically, board 70 is set on base plate 60 of stage 52, and stage 52 is moved under second shaping unit 24. Then, in second shaping unit 24, resin laminate 130 is formed on board 70, as shown in FIG. 3. Resin laminate 130 is formed by repeating discharge of the ultraviolet curable resin from inkjet head 88 and irradiation of the discharged ultraviolet curable resin with ultraviolet rays by irradiation device 92.

More specifically, in second printing section 84 of second shaping unit 24, inkjet head 88 discharges the ultraviolet curable resin in a thin film shape onto an upper surface of board 70. Subsequently, when the ultraviolet curable resin is discharged in a thin film shape, the ultraviolet curable resin is flattened by flattening device 90 in curing section 86, such that the ultraviolet curable resin has a uniform film thickness. Then, irradiation device 92 irradiates the thin film-shaped ultraviolet curable resin with ultraviolet rays. As a result, thin film-shaped resin layer 132 is formed on board 70.

Subsequently, inkjet head 88 discharges the ultraviolet curable resin in a thin film shape onto thin film-shaped resin layer 132. Then, the thin film-shaped ultraviolet curable resin is flattened by flattening device 90, irradiation device 92 irradiates the ultraviolet curable resin discharged in a thin film shape with ultraviolet rays, and as a result, thin film-shaped resin layer 132 is laminated on thin film-shaped resin layer 132. As described above, by repeating the discharge of the ultraviolet curable resin onto thin film-shaped resin layer 132 and the irradiation of ultraviolet rays, multiple resin layers 132 are laminated and resin laminate 130 is formed.

Figure 4:
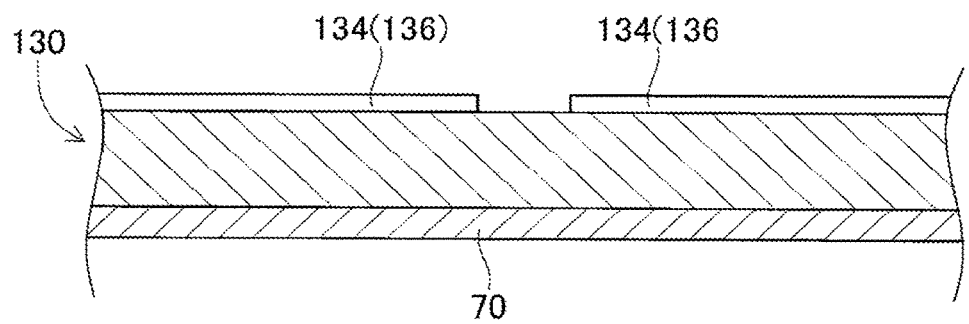
FIG. 4 is a cross-sectional view showing the circuit in a state where a wiring is formed on the resin laminate.

When resin laminate 130 is formed by the above-described procedure, stage 52 is moved under first shaping unit 22. Then, in first printing section 72 of first shaping unit 22, inkjet head 76 linearly discharges metal ink 134 onto the upper surface of resin laminate 130 in accordance with a circuit pattern as shown in FIG. 4. Subsequently, in firing section 74 of first shaping unit 22, laser irradiation device 78 irradiates metal ink 134 discharged in accordance with the circuit pattern with laser. As a result, metal ink 134 is fired, and wiring 136 is formed on resin laminate 130.

Figure 5:
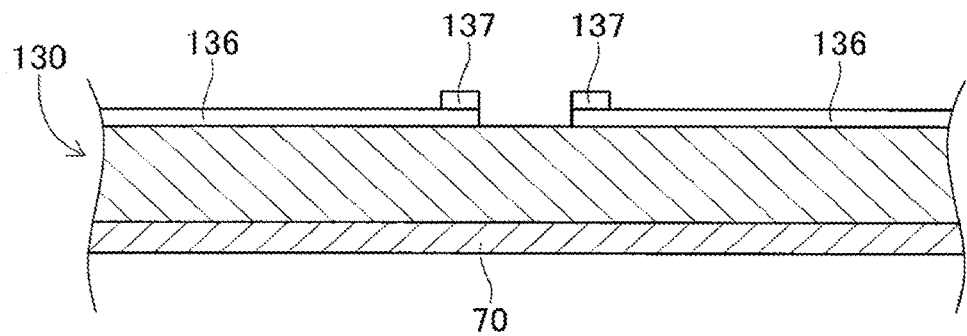
FIG. 5 is a cross-sectional view showing a circuit in a state where a conductive resin paste is applied on the wiring.

Subsequently, when wiring 136 is formed on resin laminate 130, stage 52 is moved under third shaping unit 26. Then, in third printing section 100 of third shaping unit 26, as shown in FIG. 5, transfer device 106 transfers conductive resin paste 137 onto the end portions of wiring 136. That is, conductive resin paste 137 is adhered to the tip portion of the transfer pin in the tray, and conductive resin paste 137 adhered to the tip portion of the transfer pin is transferred onto wiring 136.

Figure 6:
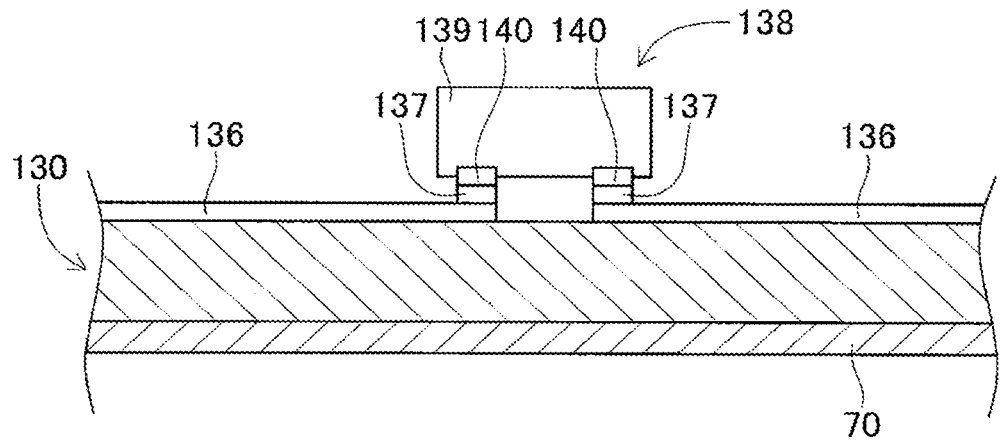
FIG. 6 is a cross-sectional view showing the circuit in a state where the electronic component is mounted.

Thus, when conductive resin paste 137 is discharged onto wiring 136, stage 52 is moved under mounting unit 27. In mounting unit 27, electronic component 138 is supplied by tape feeder 114, and electronic component 138 is held by the suction nozzle of mounting head 116. Electronic component 138 is made of component main body 139 and two electrodes 140 disposed on the lower surface of component main body 139. Then, mounting head 116 is moved by moving device 118, electronic component 138 held by the suction nozzle is mounted on the upper surface of resin laminate 130 as shown in FIG. 6. At this time, electronic component 138 is mounted on the upper surface of resin laminate 130, such that electrode 140 of electronic component 138 is in contact with conductive resin paste 137 transferred onto wiring 136. Since the lower surface of electrode 140 protrudes downward from the lower surface of component main body 139, electrode 140 is in contact with conductive resin paste 137 suitably. Then, conductive resin paste 137 is heated, by exhibiting conductivity, electrode 140 is conductive with wiring 136 via conductive resin paste 137, the circuit is formed.

Figure 7:
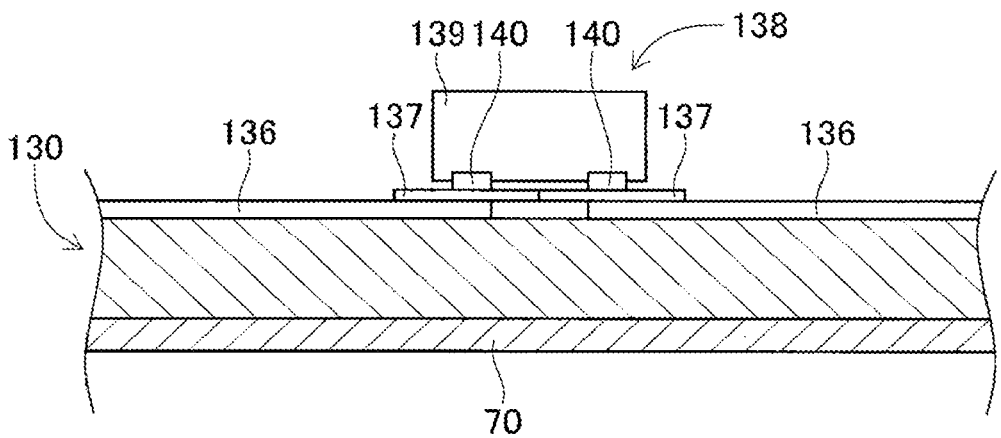
FIG. 7 is a cross-sectional view showing a circuit in a short circuited state.

However, when electronic component 138 is mounted on resin laminate 130, electronic component 138 is pressed toward resin laminate 130 in order to improve the adhesion with conductive resin paste 137. At this time, as described above, since the transfer amount of the conductive resin paste is ununiform, when the transfer amount of the conductive resin paste is large, conductive resin paste 137 may be crushed by pressing electronic component 138 and spread in the lateral direction as shown in FIG. 7. Therefore, conductive resin paste 137 transferred to the wiring corresponding to first electrode 140 of two electrodes 140 and conductive resin paste 137 transferred to the wiring corresponding to second electrode 140 are in contact, and a short circuit may occur between electrodes. On the other hand, when the transfer amount of the conductive resin paste is small, connection failure may occur between electrode 140 and wiring 136.

Figure 8:
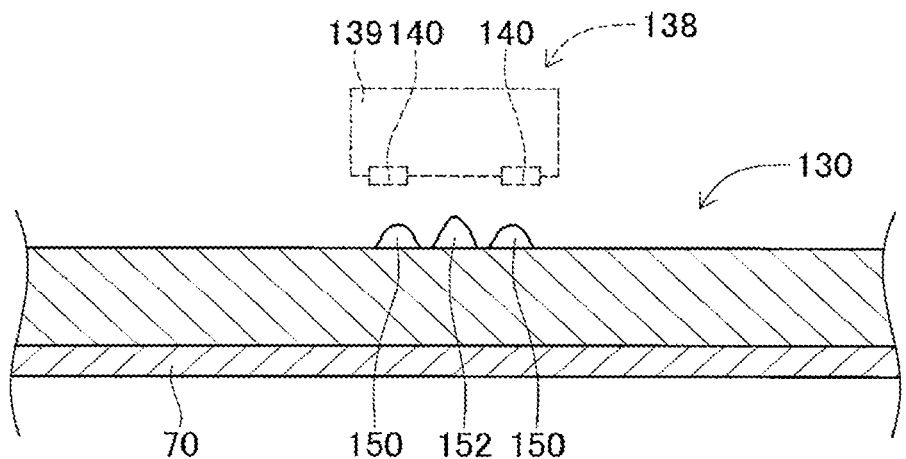
FIG. 8 is a cross-sectional view showing a circuit in a state where an electrode corresponding protruding portion and an electrode non-corresponding protruding portion are formed on the resin laminate.
Figure 9:
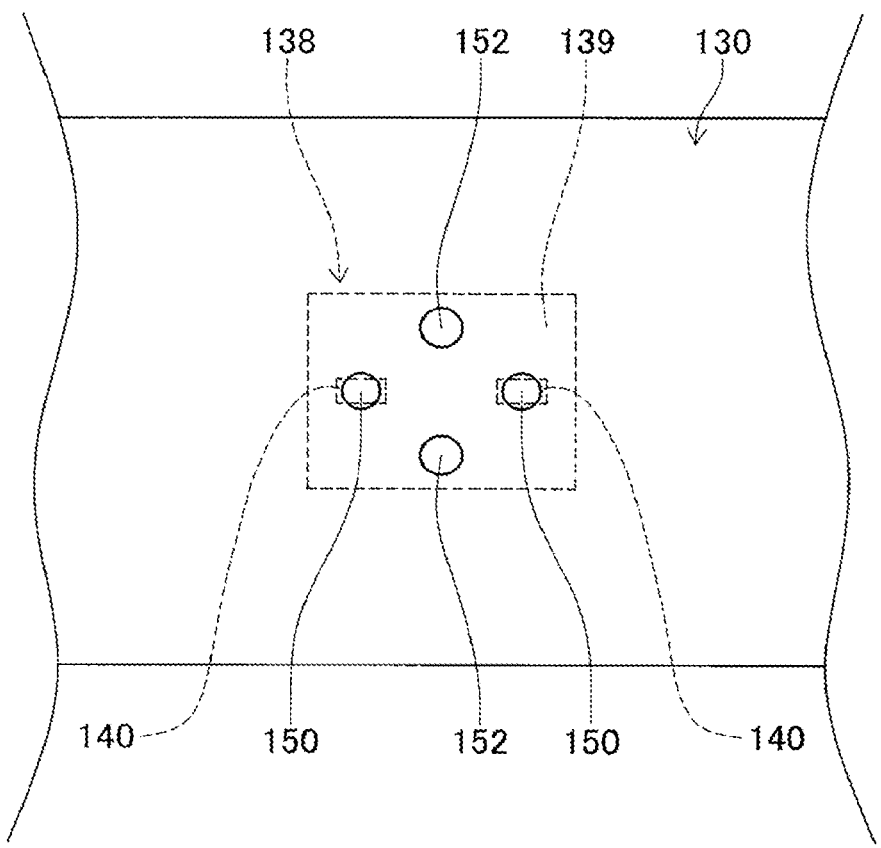
FIG. 9 is a plan view showing a circuit in a state where an electrode corresponding protruding portion and an electrode non-corresponding protruding portion are formed on the resin laminate.

In view of the above, in circuit formation device 10, a protruding portion is formed on resin laminate 130, in the protruding portion, wiring 136 and electrode 140 are connected via conductive resin paste 137. More specifically, when resin laminate 130 is formed, two types of protruding portions are formed on the upper surface of resin laminate 130 by discharging the ultraviolet curable resin before wiring 136 is formed. A first protruding portion 150 of two types of protruding portions (hereinafter, referred to as "electrode corresponding protruding portion") is formed, such that protruding portion 150 overlaps with a disposition planned position of electronic component 138 of electrode 140, on the upper surface of resin laminate 130, as shown in FIGS. 8 and 9. That is, since electronic component 138 has two electrodes 140, two electrode corresponding protruding portion 150 are formed. FIG. 8 is a view showing resin laminate 130 from a side viewpoint, and FIG. 9 is a view showing resin laminate 130 from an upper viewpoint. Further, electronic component 138 in FIGS. 7 and 8, in order to indicate the disposition planned position of electrode 140, is described by a dotted line, and electronic component 138 is not present at a time of work in FIGS. 7 and 8.

A second protruding portion 152 of two types of protruding portions (hereinafter, referred to as "electrode non-corresponding protruding portion") is formed, such that protruding portion 152 overlaps with the disposition planned position of electronic component 138, but does not overlap with the disposition planned position of electrode 140, on the upper surface of resin laminate 130. At this time, two electrode non-corresponding protruding portions 152 are symmetrically formed by sandwiching the center of the lines connecting two electrode corresponding protruding portions 150. That is, electrode non-corresponding protruding portion 152 is formed, such that lines connecting two electrode corresponding protruding portions 150 and lines connecting two electrode non-corresponding protruding portions 152 are orthogonal each other at the center of each line. Thus, two electrode corresponding protruding portions 150 and two electrode non-corresponding protruding portions 152 are formed in roughly equally spaced four positions. In FIG. 8, only one electrode non-corresponding protruding portion 152 is shown. Electrode corresponding protruding portion 150 and electrode non-corresponding protruding portion 152 are formed by discharging and curing the ultraviolet curable resin in second shaping unit 24, but the formation method thereof is the same as the formation method of resin laminate 130, and therefore the description thereof is omitted.

Further, the shapes of electrode corresponding protruding portion 150 and electrode non-corresponding protruding portion 152 are generally conical in shape, and the outer diameter is smaller when it gets close to the center of the shape. In other words, the shapes of electrode corresponding protruding portion 150 and electrode non-corresponding protruding portion 152 are mountain shapes, and a height dimension is higher when it gets close to the center of the shape. The upper ends of electrode corresponding protruding portion 150 and electrode non-corresponding protruding portion 152 are not sharp and are gradual upper ends. A height dimension of electrode corresponding protruding portion 150 and electrode non-corresponding protruding portion 152 is assumed to correspond to a maximum dimension of metal particles contained in conductive resin paste 137. However, electrode corresponding protruding portion 150 and electrode non-corresponding protruding portion 152 have different heights, electrode corresponding protruding portion 150 is slightly lower than electrode non-corresponding protruding portion 152. Incidentally, a difference between a height dimension of electrode corresponding protruding portion 150 and a height dimension of electrode non-corresponding protruding portion 152 is assumed to correspond to the distance between the lower surface of component main body 139 and the lower surface of electrode 140 of electronic component 138.

Figure 10:
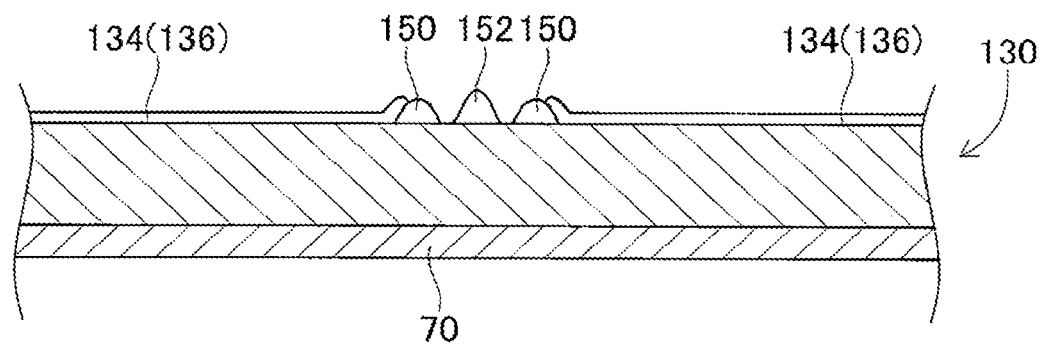
FIG. 10 is a cross-sectional view showing a circuit in a state where the wiring in contact with the electrode corresponding protruding portion is formed.
Figure 11:
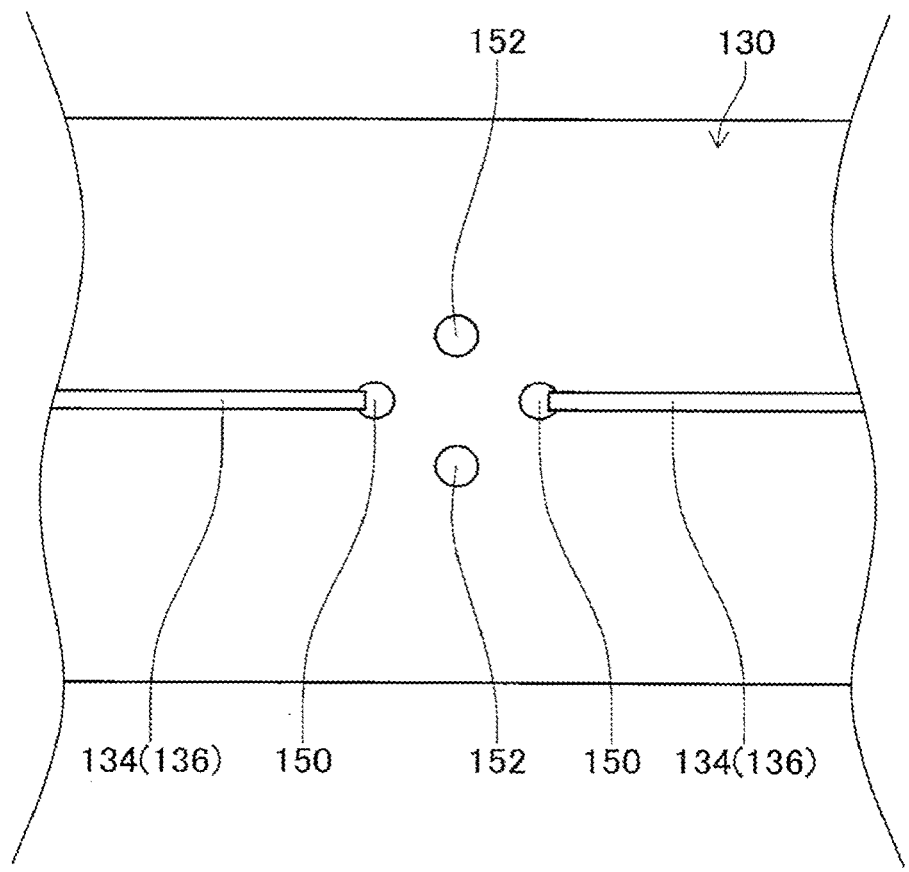
FIG. 11 is a plan view showing a circuit in a state where the wiring in contact with the electrode corresponding protruding portion is formed.

Then, when electrode corresponding protruding portion 150 and electrode non-corresponding protruding portion 152 are formed on resin laminate 130, stage 52 is moved under first shaping unit 22. At this time, in first printing section 72 of first shaping unit 22, inkjet head 76 discharges metal ink 134 until metal ink 134 reaches protruding portion 150, such that metal ink 134 extends toward electrode corresponding protruding portion 150, as shown in FIGS. 10 and 11. Metal ink 134 is discharged not to reach the upper end of electrode corresponding protruding portion 150, but to reach the center part of the side surface of electrode corresponding protruding portion 150. Then, in firing section 74 of first shaping unit 22, laser irradiation device 78 irradiates a laser to metal ink 134. As a result, the metal ink is fired to form wiring 136 connected to electrode corresponding protruding portion 150.

Figure 12:
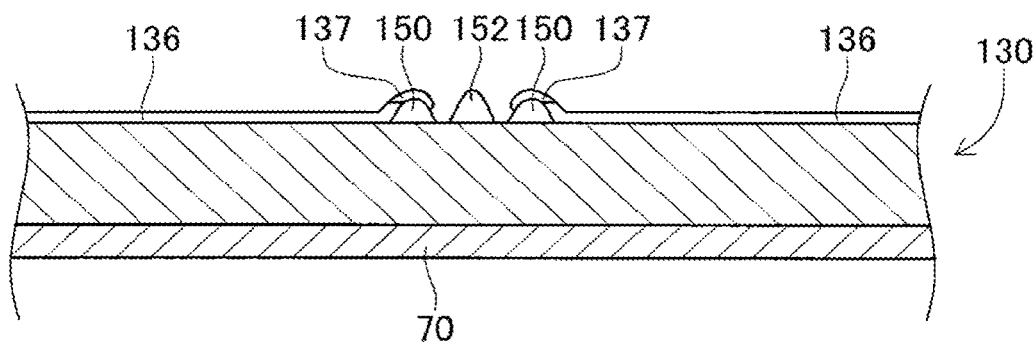
FIG. 12 is a cross-sectional view showing a circuit in a state where the conductive resin paste is applied on the electrode corresponding protruding portion.

Next, when wiring 136 in a state of being connected to electrode corresponding protruding portion 150 is formed, stage 52 is moved under third shaping unit 26. Then, in third printing section 100 of third shaping unit 26, transfer device 106, as shown in FIG. 12, transfers, such that conductive resin paste 137 covers the upper end of electrode corresponding protruding portion 150, conductive resin paste 137 on electrode corresponding protruding portion 150. At this time, conductive resin paste 137 is transferred, such that wiring 136 and electrode corresponding protruding portion 150 are connected each other, on wiring 136 and electrode corresponding protruding portion 150.

Figure 13:
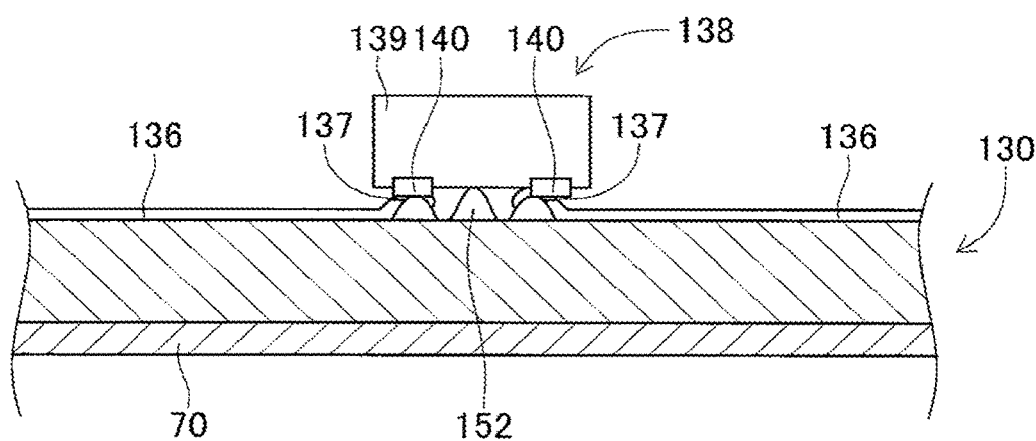
FIG. 13 is a cross-sectional view showing a circuit in a state where the electronic component is mounted.

Thus, when conductive resin paste 137 is discharged onto electrode corresponding protruding portion 150, stage 52 is moved under mounting unit 27. In mounting unit 27, electronic component 138 is supplied by tape feeder 114, and electronic component 138 is held by the suction nozzle of mounting head 116. Then, mounting head 116 is moved by moving device 118, electronic component 138 held by the suction nozzle, as shown in FIG. 13, is mounted on the upper surface of resin laminate 130. At this time, electronic component 138 is mounted, such that electrode 140 of electronic component 138 is in contact with conductive resin paste 137 transferred onto electrode corresponding protruding portion 150. In order to increase the adhesion between conductive resin paste 137 and electrodes 140, electronic component 138 is pressed toward component main body 139.

When electronic component 138 is pressed in this manner, conductive resin paste 137 enters between electrode corresponding protruding portion 150 and electrodes 140 by the capillary phenomenon, and a short circuit, a connection failure, and the like are prevented. Specifically, when electronic component 138 is pressed, the gap between electrode 140 and electrode corresponding protruding portion 150 is narrowed. In addition, capillary phenomenon is a phenomenon in which a thin tubular object, for example, a fluid inside a capillary tube rises in a tube, and a fluid tends to enter a narrow gap. Therefore, when the gap between electrode 140 and electrode corresponding protruding portion 150 is narrowed, conductive resin paste 137 enters between electrode 140 and electrode corresponding protruding portion 150. Further, since electrode corresponding protruding portion 150 is generally conical in shape, even when electronic component 138 is pressed, the gap between electrode 140 and electrode corresponding protruding portion 150 is approximately secured. At this time, for example, even when the transfer amount of conductive resin paste is large, electronic component 138 and electrode corresponding protruding portion 150 is narrowed by pressing electronic component 138, and therefore conductive resin paste 137 enters the gap, the spread in the lateral direction of conductive resin paste 137 is suppressed. Thus, a short circuit between the electrodes can be prevented.

In addition, it is also possible to explain the suppression of the spread of conductive resin paste 137 in the lateral direction using an expression indicating the volume of conductive resin paste 137 rather than the capillary phenomenon described above. Specifically, when electrode 140 and electrode corresponding protruding portion 150 approach each other by pressing electronic component 138, the upper end of electrode corresponding protruding portion 150 and electrode 140 are in contact, and conductive resin paste 137 enters the periphery thereof. Therefore, conductive resin paste 137 has a generally annular shape. However, in order to simplify the expression, assuming that conductive resin paste 137 has a cylindrical shape, volume V of conductive resin paste 137 is indicated by the following expression.

$$V=\pi r^2 h$$

Then, by pressing electronic component 138, when the height of conductive resin paste 137 of the cylindrical shape which is a distance corresponding to $\Delta h$ becomes low, and the radius of conductive resin paste 137 of the cylindrical shape which is a distance corresponding $\Delta r$ becomes wide, volume V of conductive resin paste 137 is indicated by the following expression.

$$V=\pi(r+\Delta r)^2(h-\Delta h)$$

Next, when the expression is developed and arranged, the following expression is established.

$$1-(\Delta h/h)=\{1/(1+\Delta r/r)\}^2$$

Then, the following relational expression is derived based on the expression.

$$\Delta h/h \approx 2(\Delta r/r)$$

In this relational expression, $\Delta h/h$ is a decrease amount of the height of conductive resin paste 137 with respect to the original height of conductive resin paste 137 of the cylindrical shape. That is, Δh/h is the decreasing rate of the height of conductive resin paste 137 of the cylindrical shape. On the other hand, Δr/r is an increase amount of the radius of conductive resin paste 137 with respect to the original radius of conductive resin paste 137 of the cylindrical shape. That is, Δr/r is the increasing rate of the radius of conductive resin paste 137 of the cylindrical shape. From above, the increasing rate of the radius of conductive resin paste 137 of the cylindrical shape is a half of the decreasing rate of the height of conductive resin paste 137 of the cylindrical shape. That is, for example, the height of conductive resin paste 137 of the cylindrical shape is a distance corresponding to 20% of the original height, even if the height of conductive resin paste 137 of the cylindrical shape is lowered, the radius of conductive resin paste 137 of the cylindrical shape is increased only a distance corresponding to 10% of the original radius of conductive resin paste 137 of the cylindrical shape. Thus, the spread in the lateral direction of conductive resin paste 137 when electronic component 138 is pressed is suppressed. In this manner, the suppression of spread of conductive resin paste 137 in the lateral direction can be described using a mathematical expression indicating the volume of conductive resin paste 137.

Thus, when the transfer amount of the conductive resin paste is large, by conductive resin paste 137 enters between electrode 140 and electrode corresponding protruding portion 150, the spread in the lateral direction of conductive resin paste 137 is suppressed, and a short circuit is prevented. On the other hand, when the transfer amount of the conductive resin paste is small, a connection failure between electrode 140 and wiring 136 is prevented by entering conductive resin paste 137 between electrode 140 and electrode corresponding protruding portion 150. Thus, it is possible to prevent a short circuit at the time of circuit formation and the occurrence of a connection failure.

When electronic component 138 is pressed, electronic component 138 is supported by electrode corresponding protruding portion 150 on the lower surface of electrode 140, and supported by electrode non-corresponding protruding portion 152 on the lower surface of component main body 139. That is, as shown in FIG. 9, electronic component 138 in roughly equally spaced four positions is supported by a pair of electrode corresponding protruding portions 150 and a pair of electrode non-corresponding protruding portions 152. Thus, it is possible to support electronic component 138 in good balance. In particular, the lower surface of component main body 139 is set slightly higher than the lower surface of electrode 140, electrode non-corresponding protruding portion 152 is set higher than electrode corresponding protruding portion 150 by a distance corresponding to the difference between the lower surface of component main body 139 and the lower surface of electrode 140. Accordingly, it is possible to support electronic component 138 by electrode corresponding protruding portion 150 and electrode non-corresponding protruding portion 152 without rattling.

A height dimension of electrode corresponding protruding portion 150 is assumed to correspond to a maximum dimension of metal particles contained in conductive resin paste 137. Thus, it is possible to appropriately ensure that conductive resin paste 137 enters between electrode 140 and electrode corresponding protruding portion 150 when electronic component 138 is pressed.

As described above, at the time of forming wiring 136, metal ink 134 is discharged not to reach the upper end of electrode corresponding protruding portion 150, but to reach the center section of the side surface of electrode corresponding protruding portion 150. Thus, wiring 136 is not formed on the upper end of electrode corresponding protruding portion 150, is formed from the lower end of electrode corresponding protruding portion 150 to the center section of the side surface on electrode corresponding protruding portion 150. This is because when wiring 136 is formed on the upper end of electrode corresponding protruding portion 150, wiring 136 formed on the upper end of electrode corresponding protruding portion 150 is easily peeled off. Accordingly, it is possible to suppress peeling off wiring 136.

In other words, electrode corresponding protruding portion 150 and electrode non-corresponding protruding portion 152 are formed of the same ultraviolet curable resin as the material of resin laminate 130. As a result, the affinity between electrode corresponding protruding portion 150 and electrode non-corresponding protruding portion 152 and resin laminate 130 becomes high, and a circuit with high strength can be formed.

Controller 120 of control device 28 includes base formation section 160, protruding portion formation section 162, wiring formation section 164, paste application section 166, and component placement section 168 as shown in FIG. 2. Base formation section 160 is a functional section for forming resin laminate 130. protruding portion formation section 162 is a functional section for forming electrode corresponding protruding portion 150 and electrode non-corresponding protruding portion 152. Wiring formation section 164 is a functional section for forming wiring 136. Paste application section 166 is a functional section for transferring conductive resin paste 137 onto electrode corresponding protruding portion 150. Component placement section 168 is a functional section for placing electronic component 138, such that electrode corresponding protruding portion 150 and electrode 140 overlap.

In the above embodiment, resin laminate 130 is an example of a base. Resin layer 132 is an example of a resin layer. Metal ink 134 is an example of a metal-containing liquid. Wiring 136 is an example of a wiring. Conductive resin paste 137 is an example of a resin paste. Electronic component 138 is an example of a component. Electrode 140 is an example of an electrode. Electrode corresponding protruding portion 150 is an example of a protruding portion and a contact protruding portion. Electrode non-corresponding protruding portion 152 is an example of a non-contact protruding portion. An ultraviolet curable resin is an example of a curable viscous fluid. A step performed by the base formation section 160 is an example of a base formation step. A step performed by the protruding portion formation section 162 is an example of a protruding portion formation step. A step performed by wiring formation section 164 is an example of a wiring formation step. A step performed by paste application section 166 is an example of a paste application step. A step performed by component placement section 168 is an example of a component placement step.

The present disclosure is not limited to the embodiments described above, and can be implemented in various embodiments with various modifications and improvements based on the knowledge of those skilled in the art. For example, in the above embodiment, electrode corresponding protruding portion 150 and electrode non-corresponding protruding portion 152 are formed of an ultraviolet curable resin, but it is possible to adopt a curable viscous fluid such as metal ink 134 and conductive resin paste 137 In the above embodiment, metal ink 134 is fired by laser irradiation, but may be fired by other methods such as heating.

In the above embodiment, wiring 136 is formed of metal ink 134, but wiring 136 may be formed of conductive resin paste 137. However, in a case where wiring 136 is formed of conductive resin paste 137, it is necessary to adopt a resin paste of a different type from conductive resin paste 137 as a paste to be applied on electrode corresponding protruding portion 150.

Figure 14:
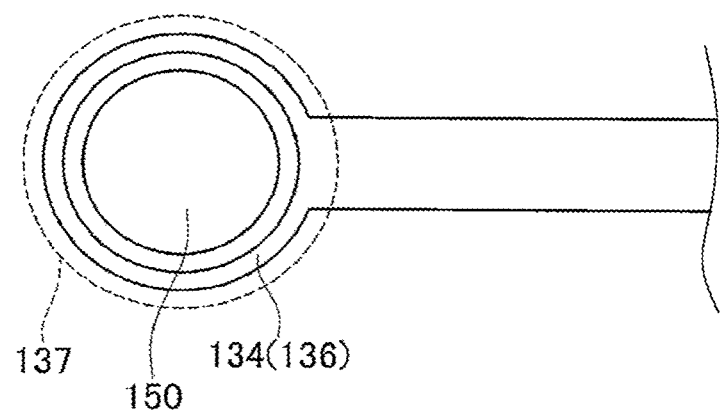
FIG. 14 is a plan view showing a circuit in a state where the wiring of the modification example is formed.

Further, in the above embodiment, wiring 136 is formed until wiring 136 is reached to electrode corresponding protruding portion 150, and is connected to electrode corresponding protruding portion 150, but wiring 136 may be formed such that wiring 136 extends toward electrode corresponding protruding portion 150 in a state of not being connected to electrode corresponding protruding portion 150. For example, as shown in FIG. 14, metal ink 134 is discharged, such that metal ink 134 approaches electrode corresponding protruding portion 150. At this time, metal ink 134 is not discharged onto electrode corresponding protruding portion 150. Metal ink 134 is discharged with a slight gap from the outer edge of the electrode corresponding protruding portion 150, such that metal ink 134 surrounds the periphery of electrode corresponding protruding portion 150. Thus, wiring 136 is formed, such that wiring 136 extends toward electrode corresponding protruding portion 150 in a state of not being connected to electrode corresponding protruding portion 150. Conductive resin paste 137 is applied, such that wiring 136 and electrode corresponding protruding portion 150 are connected to each other, on wiring 136 and electrode corresponding protruding portion 150. Accordingly, it is possible to achieve the same effect as in the above embodiment.

In the above embodiment, electrode corresponding protruding portion 150 and electrode non-corresponding protruding portion 152 are generally conical in shape, but it is not limited to the conical shape, it is possible to adopt various shapes such as a columnar shape or a cylindrical shape. However, in order to ensure the gap between electrode 140 and electrode corresponding protruding portion 150 when electronic component 138 is pressed, it is preferable that there is a different portion of the height in the vertical direction such as an inclined section and a step section on the upper surface of electrode corresponding protruding portion 150.

In the above embodiment, conductive resin paste 137 is transferred by transfer device 106, but may be discharged by a dispense head. Thus, conductive resin paste 137 may be printed by screen printing.

REFERENCE SIGNS LIST

130: Resin laminate (base), 132: resin layer, 134: metal ink (metal-containing liquid), 136: wiring, 137: conductive resin paste (resin paste), 138: electronic component (component), 140: electrode, 150: electrode corresponding protruding portion (protruding portion) (contact protruding portion), 152: electrode non-corresponding protruding portion (non-contact protruding portion), 160: base formation section (base formation step), 162: protruding portion formation section (protruding portion formation step), 164: wiring formation section (wiring formation step), 166: paste application section (paste application step), 168: component placement section (component placement step)

The invention claimed is:

1. A circuit formation method comprising:
a protruding portion formation step of forming a protruding portion by applying a curable viscous fluid in a generally conical shape onto a base and curing the curable viscous fluid;
a wiring formation step of forming a wiring extending toward the protruding portion by applying a metal-containing liquid containing metal particles onto the base so that the metal-containing liquid becomes conductive;
a paste application step of applying a resin paste, containing metal particles different from the metal-containing liquid, on the protruding portion and the wiring, such that the protruding portion and the wiring are connected to each other; and
a component placement step of placing a component having an electrode onto the base, such that the electrode is in contact with the resin paste applied on the protruding portion,
wherein, in the protruding portion formation step, a contact protruding portion as the protruding portion is formed by applying the curable viscous fluid onto the base at a scheduled placement position of the electrode of the component to be placed in the component placement step and curing the curable viscous fluid, and a non-contact protruding portion is formed by applying the curable viscous fluid onto the base at a position other than the scheduled placement position of the electrode of the component to be placed in the component placement step and curing the curable viscous fluid.

2. The circuit formation method according to claim 1, wherein, in the protruding portion formation step, the protruding portion is formed by applying a curable resin, as the curable viscous fluid, onto the base and curing the curable resin.

3. The circuit formation method according to claim 2, further comprising a base formation step of forming a resin layer by applying the curable resin in a thin film shape and forming the base by laminating the resin layer.

4. The circuit formation method according to claim 1, wherein, in the protruding portion formation step, the contact protruding portion and the non-contact protruding portion are formed at different heights.

5. The circuit formation method according to claim 1, wherein, in the protruding portion formation step, the protruding portion having a height corresponding to a maximum dimension of the metal particles contained in the resin paste is formed.

6. The circuit formation method according to claim 1, wherein the metal-containing liquid contains nanometer-sized metal fine particles, and the resin paste contains micrometer-sized metal particles.

7. The circuit formation method according to claim 1, wherein a difference between height of the contact protruding portion and a height the non-contact protruding portion corresponds to a distance between a lower surface of a main body of the component and a lower surface of the electrode.

8. A circuit formation method comprising:
a protruding portion formation step of forming a protruding portion by applying a curable viscous fluid onto a base and curing the curable viscous fluid;
a wiring formation step of forming a wiring extending toward the protruding portion by applying a metal-containing liquid containing metal particles onto the base so that the metal-containing liquid becomes conductive;

a paste application step of applying a resin paste, containing metal particles different from the metal-containing liquid, on the protruding portion and the wiring, such that the protruding portion and the wiring are connected to each other; and a component placement step of placing a component having an electrode onto the base, such that the electrode is in contact with the resin paste applied on the protruding portion, wherein, in the wiring formation step, the wiring connected to the protruding portion is formed by applying the metal-containing liquid onto the base until the metal-containing liquid reaches the protruding portion and firing the metal-containing liquid.

9. A circuit formation method comprising:

a protruding portion formation step of forming a protruding portion by applying a curable viscous fluid onto a base and curing the curable viscous fluid;

a wiring formation step of forming a wiring extending toward the protruding portion by applying a metal-containing liquid containing metal particles onto the base so that the metal-containing liquid becomes conductive;

a paste application step of applying a resin paste, containing metal particles different from the metal-containing liquid, on the protruding portion and the wiring, such that the protruding portion and the wiring are connected to each other; and a component placement step of placing a component having an electrode onto the base, such that the electrode is in contact with the resin paste applied on the protruding portion, wherein, in the wiring formation step, the wiring extending toward the protruding portion in a state of not being connected to the protruding portion is formed by applying the metal-containing liquid onto the base, such that the metal-containing liquid approaches the protruding portion and firing the metal-containing liquid.

* * * * *